United States Patent [19]

Jensen et al.

[11] Patent Number: 4,908,757

[45] Date of Patent: Mar. 13, 1990

[54] STATIC FREQUENCY CONVERTER, ESPECIALLY A FREQUENCY CONVERTER CONTROLLING AND/OR ADJUSTING THE PERFORMANCE DATA OF AN ELECTROMOTOR

[75] Inventors: Niels D. Jensen; Jorgen Christensen, both of Bjerringbro, Denmark

[73] Assignee: Grundfos International A/S, Denmark

[21] Appl. No.: 303,099

[22] Filed: Jan. 27, 1989

Related U.S. Application Data

[63] Continuation of Ser. No. 131,803, Dec. 11, 1987, abandoned.

[30] Foreign Application Priority Data

Dec. 13, 1986 [DE] Fed. Rep. of Germany ....... 3642723

[51] Int. Cl.$^4$ .............................................. H02M 1/00
[52] U.S. Cl. .................................... 363/141; 361/385; 310/54
[58] Field of Search ................ 363/141, 145; 361/381, 361/382, 385, 387; 310/52, 54, 61, 68 C, 68 D

[56] References Cited

U.S. PATENT DOCUMENTS

| | | | |
|---|---|---|---|
| 1,694,151 | 12/1928 | Waite | 363/141 X |
| 2,951,165 | 8/1960 | Arutunoff | 310/54 |
| 3,369,166 | 2/1968 | Lake | 363/141 X |
| 3,600,636 | 8/1971 | Peterson | 361/382 |
| 3,626,252 | 12/1971 | Cath | 361/387 |
| 3,805,140 | 4/1974 | Takahashi et al. | 363/141 |
| 3,909,678 | 9/1975 | Rifkin et al. | 361/385 |
| 3,999,105 | 12/1976 | Archey et al. | 361/385 |
| 4,053,942 | 10/1977 | Dougherty et al. | 361/385 |
| 4,262,224 | 4/1981 | Kofink et al. | 310/68 D |

FOREIGN PATENT DOCUMENTS

| | | | |
|---|---|---|---|
| A1114000 | 7/1984 | European Pat. Off. | |
| A1183850 | 6/1986 | European Pat. Off. | |
| 2015518 | 10/1970 | Fed. Rep. of Germany | |
| 2836710 | 2/1980 | Fed. Rep. of Germany | |
| 2364773 | 7/1984 | Fed. Rep. of Germany | |
| 1039601 | 8/1966 | United Kingdom | 361/385 |
| 1137266 | 12/1968 | United Kingdom | |
| 1144121 | 3/1969 | United Kingdom | |

OTHER PUBLICATIONS

IBM Technical Disclosure Bulletin 18, "Cooling Cap for Powder or Liquid Filled Modules", No. 5, 1387-1388, 10/75.
IBM Technical Disclosure Bulletin 14, "Substrate Mounted Heat Pipe for Chip Cooling", No. 9, 2690, 2/72.
IBM Technical Disclosure Bulletin 13, "Self-Cooling Heat Exchanger-Condenser", No. 5, 1048, 10/70.
IBM Technical Disclosure Bulletin 21, "Metal Wood and Idium Heat Sink", No. 3, 1143-1144, 8/78.

*Primary Examiner*—Patrick R. Salce
*Assistant Examiner*—Kristine Peckman
*Attorney, Agent, or Firm*—Michael N. Meller

[57] ABSTRACT

The invention relates to a static frequency converter in a housing, especially a frequency converter controlling and/or adjusting the performance data of an electromotor. The housing is shaped as a pressure-resistant casing sealed toward the ambient and at least partially provided with a filler serving as a heat conductor for the dissipation of heat to the surface of the casing.

3 Claims, 3 Drawing Sheets

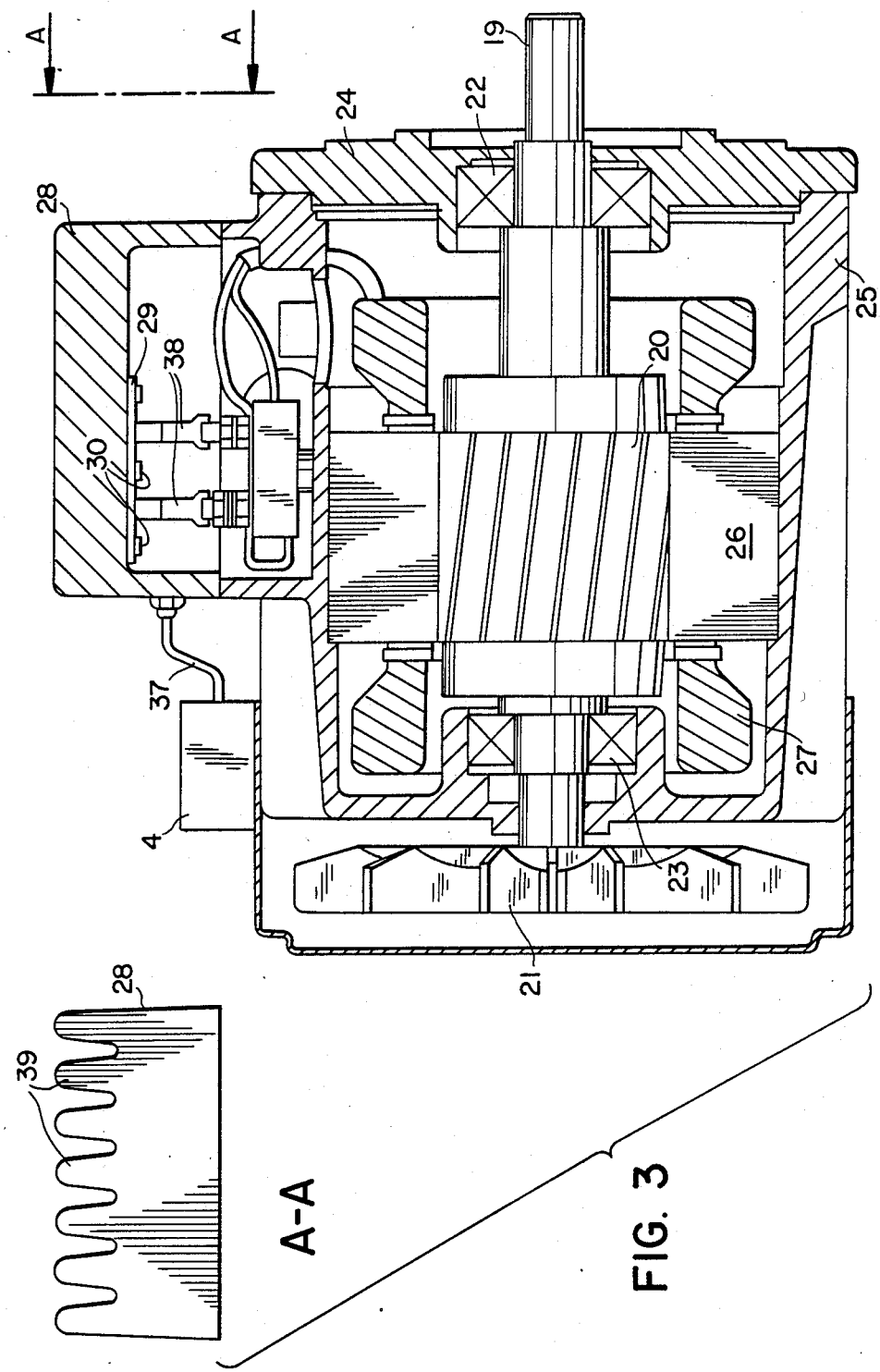

STATIC FREQUENCY CONVERTER, ESPECIALLY A FREQUENCY CONVERTER CONTROLLING AND/OR ADJUSTING THE PERFORMANCE DATA OF AN ELECTROMOTOR

This application is a continuation of application Ser. No. 131,803, filed 12/11/87, now abandoned.

FIELD OF THE INVENTION

The invention relates to a static frequency converter built in a housing, especially a frequency converter controlling and/or adjusting the performance data, such as the rotational speed and torque, of an electromotor.

BACKGROUND ART

The driving of processing machines, tools and the like by means of electromotors depends as far as the rotational speed and the torque are concerned on the type of motor and on the electric supply network. However, as a variable speed may be advantageous in many employments frequency converters may be inserted.

The known static frequency converters are bulky devices to be externally installed, and the structural dimensions of these devices depend on the necessary transmission of heat to the ambient. It turned out that the frequency converter can be miniaturized by means of a highly-integrated switching network in such a manner that it can be situated adjacent to the motor or in or on, respectively, the unit driven by the motor. The latter as well as a small structural size are, however, caused by the dissipation of heat of the frequency converter being freely liberatable so as to avoid exceeding of the prescribed thermal limit of the electronics.

In connection with, for instance, pump assemblies or ventilators the speed and torque of which must be controlled or adjusted by means of frequency converters, it is possible to utilize the liquid delivered for lowering the heat. The latter implies that specific measures must be taken when building the frequency converter.

SUMMARY OF THE INVENTION

The object of the invention is to provide a frequency converter capable of forming a structural unit together with the motor or the assembly, respectively, and which on account of its construction is suited for removing the dissipation heat in small types of construction. In satisfaction of the foregoing object and advantages there is provided by the present invention a frequency converter where the housing is shaped as a pressure resistant casing sealed towards the ambient and is provided at least partially with a filler conducting the dissipation heat to the surface of the casing.

Such a filler implies that the inner heat resistance of the frequency converter is reduced because a filler of, for instance, liquids and/or solids has a ten times higher heat-transfer coefficient compared to air, which should be considered a heat insulator. Besides the filler abutting directly or indirectly, the electronics emitting the heat forms a heat bridge having a relatively large surface to the ambient whereby the dissipation heat is distributed over a large heat exchange area.

The pressure resistant and sealed casing allows furthermore a placing of the frequency converter in the liquid delivered or to be delivered by a pump or a ventilator. The latter involves, however, a minor reduction of the outer heat resistance, said reduction being expectable by a conventional frequency converter where the dissipation heat is emitted to the ambient by free air convection.

In an underwater motor pump the frequency converter may be subjected to high ambient pressures, and the outer shape of the casing is stabilized by the filler, said casing being thin-walled on account of its heat transfer capacity and low heat resistance.

The filler may be pourable solids or liquids, such as plastic granulate, oil and the like. As the filler is in direct contact with the electronics and the interconnections of the electric structural members of the frequency converter, it must be electrically non-conductive.

The filler may also comprise a pourable solid matter and a liquid filling part of the spaces between the particles of the solid matter to form a heat-pipe-system, whereby the liquid evaporates adjacent the area where the dissipation heat is developed, said liquid condensating the vapor during emission of condensation heat at the inner surface of the casing. As a result the condensate returns to the circuit where the dissipation heat is produced.

In order to improve the emission of heat, a ducted, cooling ducts may be coupled to the outer surface of the casing. Furthermore the casing may be provided with cooling rips, beads or the like along the outer periphery in order to increase the heat exchange area.

A simple and optionally replaceable mounting of the frequency converter in a motor is enabled by contacts on the outside of the housing or the casing, respectively, of said frequency converter, said contacts allowing a plug connection to fixed contacts connecting the frequency converter to the source of energy, the terminals of motor windings, and external sensors. Furthermore according to the invention, switching units may be provided in the casing, said switching units being adjustable so as to change the output signal of the frequency converter in a conventional manner. As these switching units are not directly accessible from the outside on account of the casing, they are shaped and situated in such a manner that they are directly mechanically or electromagnetically activatable from the outside through the wall of the casing.

According to the invention the frequency converter comprises substantially an input circuit, an intermediary circuit, and an output circuit. In principle all three circuits may be situated inside the casing. However, in order to reduce the size of the frequency converter it is also possible to separate the intermediary circuit relative to the remaining two circuits, said intermediary circuit substantially comprising a capacitor and/or an inductance. The intermediary circuit may even be mounted in the stator or rotor chamber of an electromotor controlled by the frequency converter.

Finally according to the invention the operational data delivered by the output circuit of the frequency converter may be controlled by internal or external signals. The internal signals may be voltage, current, and temperature whereas the external signals may be pressure, pump volume, temperature, speed, and time. Such signals are produced by sensors or correcting members and utilized for adjusting the output data of the frequency converter.

BRIEF DESCRIPTION OF DRAWINGS

The invention will be described below with reference to the accompanying drawings, in which.

DESCRIPTION OF PREFERRED EMBODIMENTS

Figure 1:
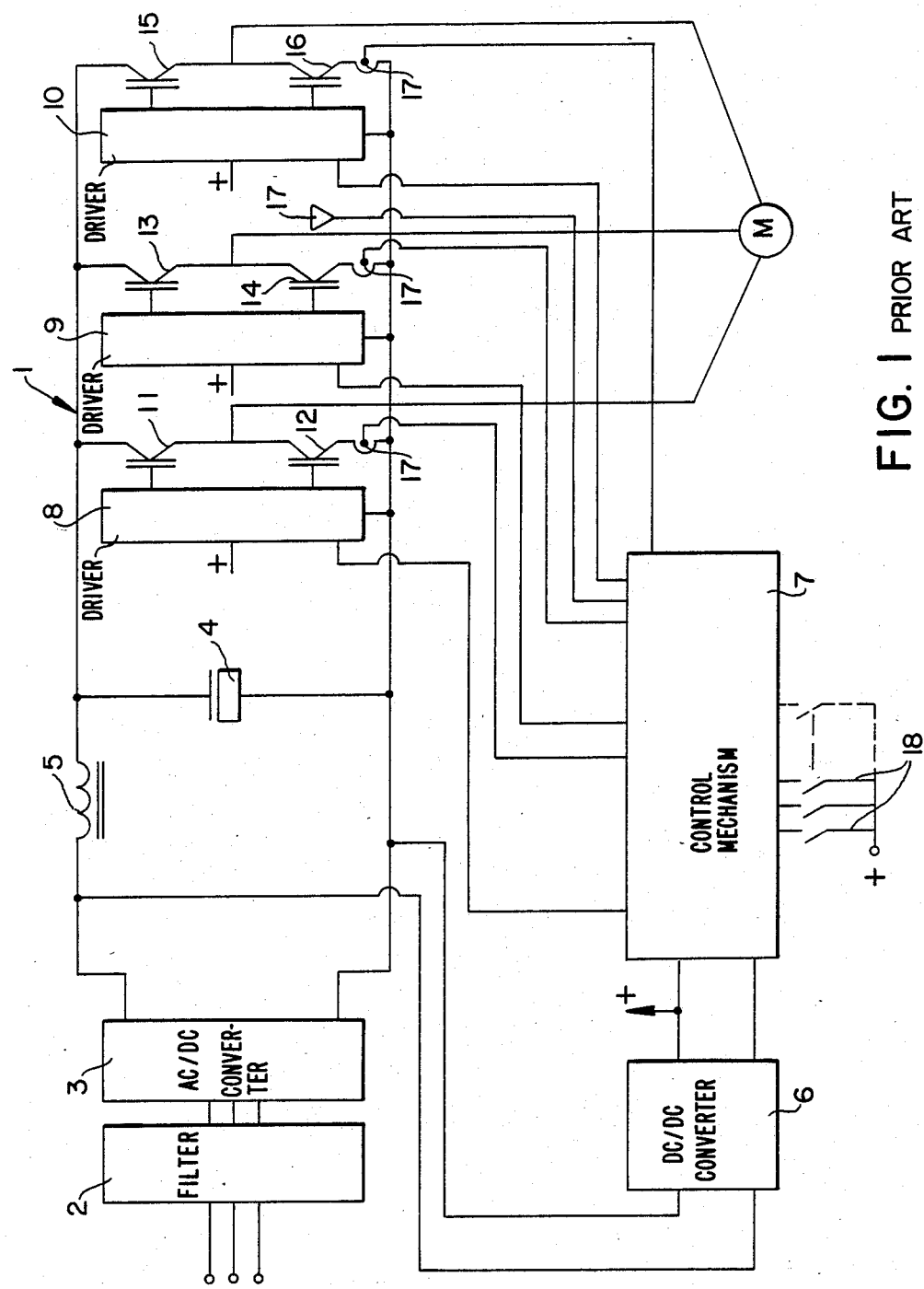
FIG. 1 illustrates a block diagram of a frequency converter.

The frequency converter 1 of FIG. 1 known per se is supplied from the three-phase mains. An interference filter 2 and a rectifier contact are provided as an AC/DC converter 3 on the input side, said AC/DC converter forming the input circuit. The frequency converter is a combined voltage and current storage, and the intermediary circuit comprises a capacitor 4 and an inductance 5. However, a voltage feeding operation would result from the omission and replacement of the inductance 5 by a simple connection, whereas a current operation of the frequency converter results from the capacitor 4, the associated connections being omitted.

The frequency converter comprises furthermore a DC/DC converter 6 and a control mechanism 7 controlling the drivers 8, 9, and 10, which are in turn connected to the power transistors 11–16 arranged in pairs. These structural members and structural groups form the output circuit of the frequency converter and are known per se and therefore not described in details. The output circuit is furthermore connected to the motor M. The frequency converter may also be connected to internal sensors, such as sensors 17 responding to current, voltage or temperature, or to external sensors and correcting members in turn connected to the control mechanism 7. Such external sensors are, for instance, sensitive to pressure, pump volume, and temperature of a pump assembly comprising a motor controlled or adjusted by a frequency converter. The correcting members are, for instance, timing circuits allowing a turning on and off of specific operational modes of the frequency converter for predetermined periods. Finally switches and circuit-breakers 18, respectively, may also be included. These switches and circuit breakers are activated by an opening and closing of prepared current circuits of the control mechanism 7 for changing the output signal of the frequency converter 7, especially for changing the amplitude and frequency thereof.

Figure 2:
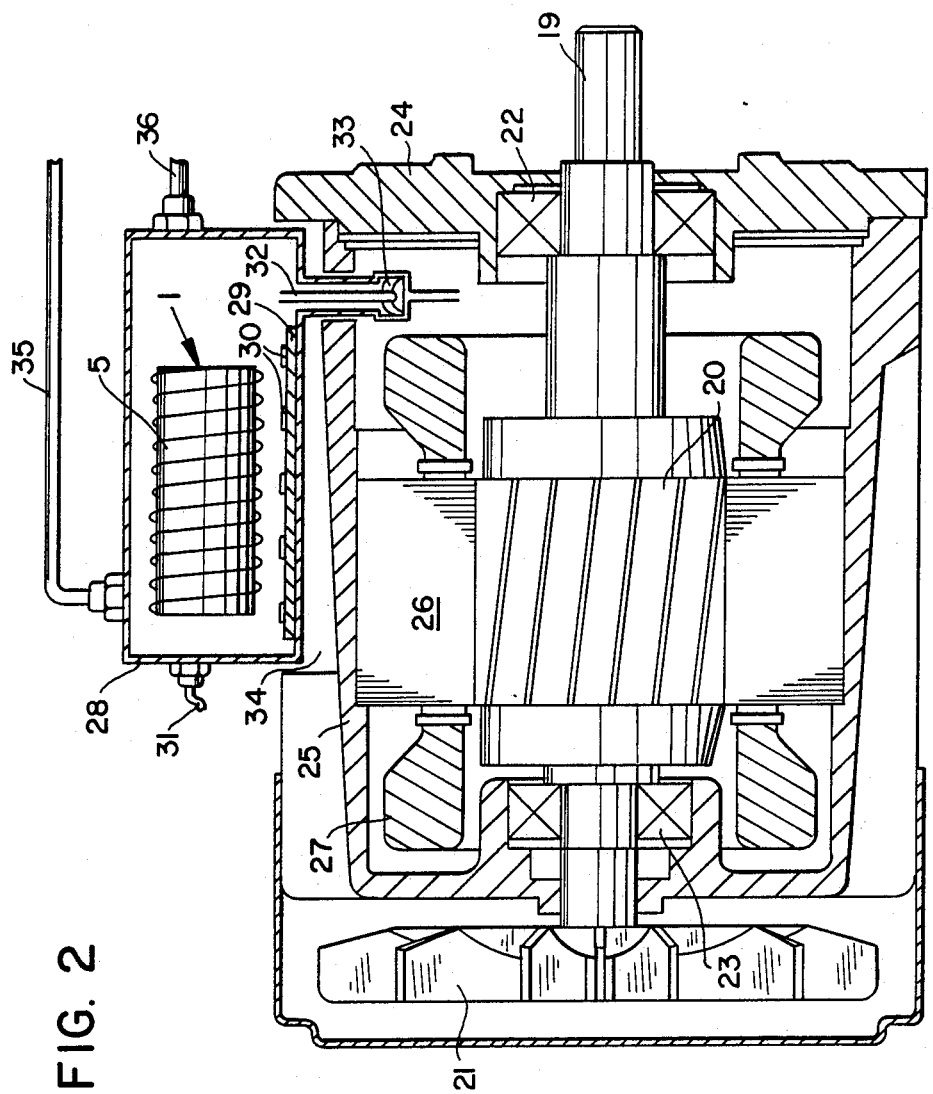
FIG. 2 is a sectional view through the mechanical structure of a frequency converter.
Figure 2:
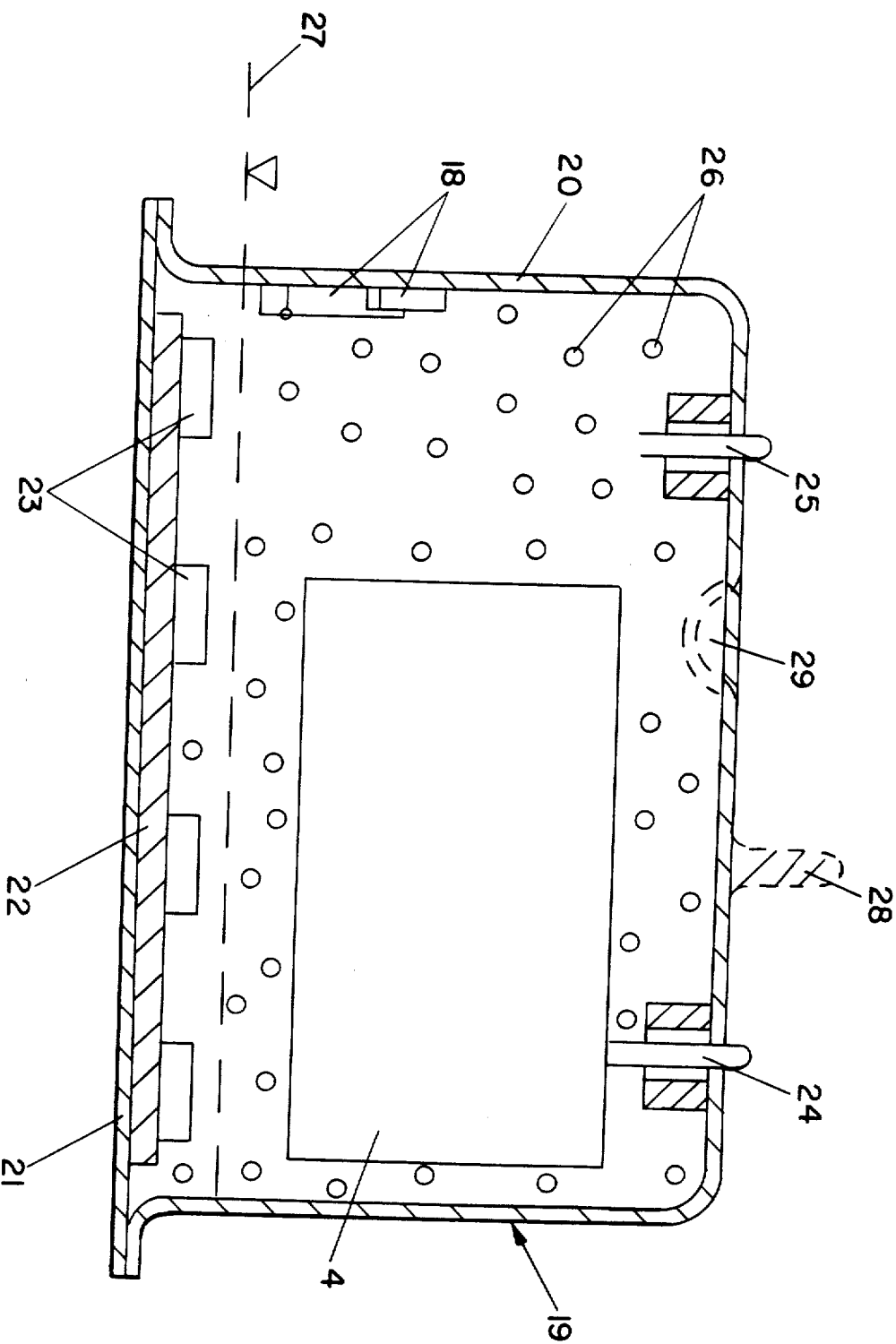

FIG. 2 illustrates the casing 19 of the frequency converter responding to voltage feeding, and this casing comprises a cup-shaped member 20 and a cover 21 tightly interconnected by gluing, welding or the like. A carrier 22 is mounted on the inside of the cover 21, said carrier carrying the electric structural members of the frequency converter, i.e. the members 2, 3, and 8–17 illustrated as small boxes in FIG. 1. The casing 19 includes furthermore the capacitor 4 and the switches 18. Finally contacts 24, 25 are provided in the upper portion of the casing, said contacts allowing a plug connection with stationary contacts in such a manner that the frequency converter can be connected to its power source, the ends of the motor windings or to external sensors. Only two of the contacts 24, 25 appear from the drawings, and they are shaped as pins and communicate with the inputs and outputs of the frequency converter.

According to the invention the casing 19 is at least partially provided with a filler serving as heat conductor for the dissipation heat and emitting said heat to the surface of the casing. The filler of FIG. 2 is made of a solid matter 26 pourable into the member 20 of the casing when the cover 21 is removed or into the interior of said casing through an opening to be closed later on again. For instance, granulate or fine-granular material is suited as solid matter. When the casing 19 is subjected to high pressures from the outside the total interior of the casing is advantageously filled with filler, said filler stabilizing the shape of the casing and making it pressure-resistant.

Beyond a solid matter or a liquid alone the filler can be made of a mixture of solids and liquids. In FIG. 2 the casing is filled with liquid to the level indicated by the arrow 27.

This liquid fills part of the interspaces of the particles 26 of the solid matter and may communicate directly with the structural members 23 and associated connections producing the dissipation heat. In this manner a heat exchanger resembling a so-called heat-pipe is provided because the liquid in the area developing dissipation heat can evaporate, rise as vapor, and be condensated either already at the particles of the solid matter immediately thereabove or at the latest at the surface of the casing while emitting condensation heat. Subsequently the condensate is again carried downwards to the area developing and receiving dissipation heat. Some of the dissipation heat is delivered through the cover 21. If the filler gets in direct contact with the current and voltage carrying members of the frequency converter, it must be made of an electrically insulating material. For instance, plastic granulate, sand, and like materials are suited as solids, whereas inter alia oil is suited as liquid filler. Besides the solid matter need not necessarily be pourable as the free interior of the casing can be filled with a preformed solid-state body. When a liquid filler is simultaneously used, the solid-state body must be formed like open cells or provided with through openings.

In order to increase the surface of the casing 19 and consequently the existing heat exchange surface, the casing member 20 is provided with cooling rips 28, beads 29 or the like means along the periphery, only one cooling rip and one bead being illustrated in FIG. 2 both diagrammatically and by dotted lines.

Existing or separately provided means affecting a ducted cooling on the casing can be used for optimizing, if necessary, the emission of dissipation heat. Examples of existing means of this type are the liquids flowing from the pumps, the ventilators or the vane wheels into the motors and in the flowing path of which the casing is optionally arranged. The dissipation heat carried through the filler to the surface of the casing is then absorbed and removed by the liquid in question.

Figure 3:
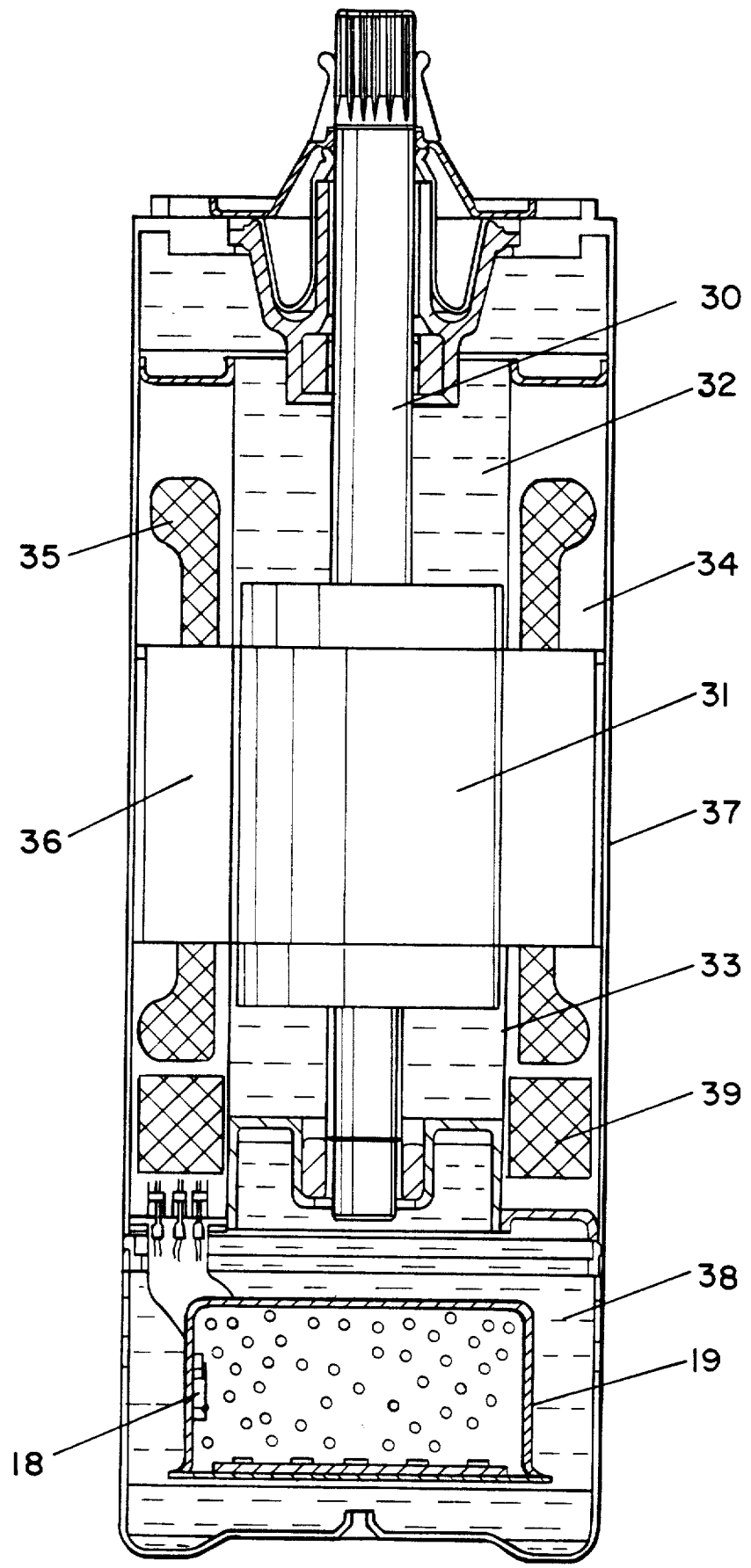
FIG. 3 is a longitudinal sectional view through an electromotor comprising an integrated frequency converter.

FIG. 3 illustrates the mounting of a frequency converter responding to current feeding in an asynchronous wet motor known per se and therefore only described briefly. The rotor sheets 31 are mounted on the shaft 30. When the motor for instance, is associated with a submerged pump assembly the rotor chamber 32 is filled with water and separated from the dry stator chamber by the collimator 33 including the motor windings 35 and the stator sheets 36.

In the drawing the housing 37 continues beyond the actual motor whereby an additional chamber 38 is provided. This chamber communicates with the rotor chamber 32 and is also filled with water receiving the heat from the frequency converter.

The input and output circuits of the casing including the frequency converter are situated in the chamber 38, whereas the intermediary circuit forming the inductivity 39 of the frequency converter is separately arranged in the stator chamber 34. The inductance is shaped as an annular coil with an iron core formed by the surrounding motor members. It is obvious that the coil is connected across electric circuits through the casing 19 between the input and output circuits of the frequency converter.

A corresponding separation of the intermediary circuit and the input and output circuits of the frequency converter is, of course, also allowed by the embodiment of FIG. 2, where the capacitor 4 is arranged outside the casing 19 in a dry chamber of a motor or a working unit driven by said motor.

The casing 19 of FIG. 3 can be shaped like the casing of FIG. 2 and also be filled completely or partially with arbitrary liquids, solids, and mixtures thereof. The fillers must be made of electrically insulating materials if they are to be in direct contact with the electronics of the frequency converter. However, in case the electronics is separately insulated, for instance, by means of a cover layer, it is, of course, also possible to use fillers of electrically conductive materials, especially metals with a good heat conducting capacity.

As already mentioned the casing must be tight if the surrounding medium is liquid or if it is filled with a liquid. If the frequency converter is used in connection with ventilators, motors cooled by means of ventilators, and the like where the surface of the casing is loaded by air only and the casing is not filled with a liquid, the casing need not be liquidtight since a casing which is airtight or at least tight against fouling suffices. If the casing material is not plastics it is advantageous to use a thin-walled sheet material, such as stainless steel, because metal has a relatively high heat transfer coefficient compared to plastics.

As previously mentioned the circuit breakers 18 are situated on the inside of the casing 19 and are not directly accessible from the outside. These circuit-breakers are mechanically or magnetically activatable from the outside. A mechanical activation is allowed by the movable contact members of the circuit breakers being adjustable as a result of a mechanical forming of the casing wall by means of a tool. These contact members can also be activated by means of magnets in turn being activated correspondingly outside the casing adjacent the circuit breakers.

The frequency converter may be modified in many ways without thereby deviating from the scope of the invention.

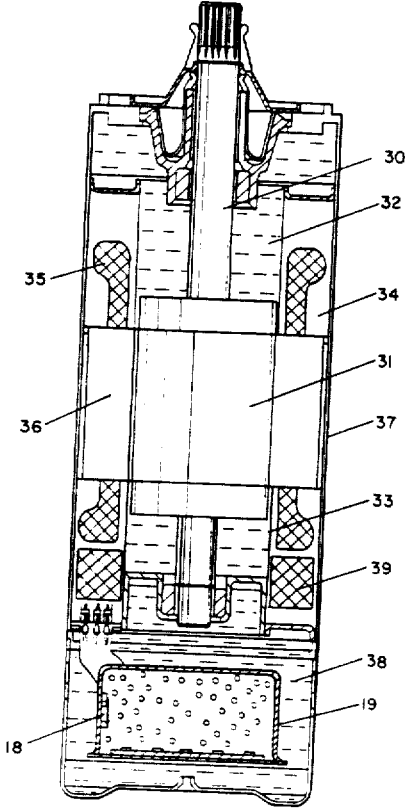

We claim:

1. A pump assembly comprising an electromotor, a rotor chamber for receiving fluid to be circulated, an additional chamber which also receives said fluid to be circulated and communicates with said rotor chamber, a housing which surrounds said electromotor and defines said additional chamber, a heat conductive casing arranged in said additional chamber, a frequency converter comprising an input circuit and an output circuit arranged inside said casing, said input circuit being coupled to a power source and said output circuit being electrically coupled to said electromotor, and heat conductive and electrically insulative filler means which fill the remaining space inside said casing, said casing being in thermal contact with and sealed from said fluid in said additional chamber, whereby said filler means conducts heat from said input and output circuits to said casing, and said casing thereafter dissipates said heat to said fluid to be circulated.

2. The pump assembly as defined in claim 1, wherein said filler means comprises solid material and liquid material in direct contact with said input and output circuits.

3. The pump assembly as defined in claim 2, wherein said solid material is in the form of particles and said casing is completely filled with said particles, the space between said particles being at least partially filled with said liquid material.

* * * * *

UNITED STATES PATENT AND TRADEMARK OFFICE
CERTIFICATE OF CORRECTION

PATENT NO. : 4,908,757

DATED : March 13, 1990

INVENTOR(S) : JENSEN et al.

It is certified that error appears in the above-identified patent and that said Letters Patent is hereby corrected as shown below:

The title page should be deleted to appear, as per attached title page.

In the drawings, sheets 2 and 3 should be replaced by the attached corrected sheets 2 and 3.

Signed and Sealed this

Second Day of June, 1992

Attest:

DOUGLAS B. COMER

Attesting Officer

Acting Commissioner of Patents and Trademarks

United States Patent [19]
Jensen et al.

[11] Patent Number: 4,908,757
[45] Date of Patent: Mar. 13, 1990

[54] STATIC FREQUENCY CONVERTER, ESPECIALLY A FREQUENCY CONVERTER CONTROLLING AND/OR ADJUSTING THE PERFORMANCE DATA OF AN ELECTROMOTOR

[75] Inventors: Niels D. Jensen; Jorgen Christensen, both of Bjerringbro, Denmark

[73] Assignee: Grundfos International A/S, Denmark

[21] Appl. No.: 303,099

[22] Filed: Jan. 27, 1989

Related U.S. Application Data

[63] Continuation of Ser. No. 131,803, Dec. 11, 1987, abandoned.

[30] Foreign Application Priority Data

Dec. 13, 1986 [DE] Fed. Rep. of Germany ....... 3642723

[51] Int. Cl.⁴ .............................................. H02M 1/00
[52] U.S. Cl. .................................. 363/141; 361/385; 310/54
[58] Field of Search ................ 363/141, 145; 361/381, 361/382, 385, 387; 310/52, 54, 61, 68 C, 68 D

[56] References Cited

U.S. PATENT DOCUMENTS

| | | | |
|---|---|---|---|
| 1,694,151 | 12/1928 | Waite | 363/141 X |
| 2,951,165 | 8/1960 | Arutunoff | 310/54 |
| 3,369,166 | 2/1968 | Lake | 363/141 X |
| 3,600,636 | 8/1971 | Peterson | 361/382 |
| 3,626,252 | 12/1971 | Cath | 361/387 |
| 3,805,140 | 4/1974 | Takahashi et al. | 363/141 |
| 3,909,678 | 9/1975 | Rifkin et al | 361/385 |
| 3,999,105 | 12/1976 | Archey et al. | 361/385 |
| 4,053,942 | 10/1977 | Dougherty et al. | 361/385 |
| 4,262,224 | 4/1981 | Kofink et al. | 310/68 D |

FOREIGN PATENT DOCUMENTS

| | | |
|---|---|---|
| A1114000 | 7/1984 | European Pat. Off. . |
| A1183850 | 6/1986 | European Pat. Off. . |
| 2015518 | 10/1970 | Fed. Rep. of Germany . |
| 2836710 | 2/1980 | Fed. Rep. of Germany . |
| 2364773 | 7/1984 | Fed. Rep. of Germany . |
| 1039601 | 8/1966 | United Kingdom ............... 361/385 |
| 1137266 | 12/1968 | United Kingdom . |
| 1144121 | 3/1969 | United Kingdom . |

OTHER PUBLICATIONS

IBM Technical Disclosure Bulletin 18, "Cooling Cap for Powder or Liquid Filled Modules", No. 5, 1387–1388, 10/75.
IBM Technical Disclosure Bulletin 14, "Substrate Mounted Heat Pipe for Chip Cooling", No. 9, 2690, 2/72.
IBM Technical Disclosure Bulletin 13, "Self-Cooling Heat Exchanger-Condenser", No. 5, 1048, 10/70.
IBM Technical Disclosure Bulletin 21, "Metal Wood and Idium Heat Sink", No. 3, 1143–1144, 8/78.

*Primary Examiner*—Patrick R. Salce
*Assistant Examiner*—Kristine Peckman
*Attorney, Agent, or Firm*—Michael N. Meller

[57] ABSTRACT

The invention relates to a static frequency converter in a housing, especially a frequency converter controlling and/or adjusting the performance data of an electromotor. The housing is shaped as a pressure-resistant casing sealed toward the ambient and at least partially provided with a filler serving as a heat conductor for the dissipation of heat to the surface of the casing.

3 Claims, 3 Drawing Sheets